United States Patent
Huang

(10) Patent No.: US 10,910,450 B2
(45) Date of Patent: Feb. 2, 2021

(54) CHIP ON FILM PACKAGE AND DISPLAY DEVICE

(71) Applicant: Novatek Microelectronics Corp., Hsinchu (TW)

(72) Inventor: Ying-Neng Huang, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/431,714

(22) Filed: Jun. 4, 2019

(65) Prior Publication Data

US 2020/0388657 A1    Dec. 10, 2020

(51) Int. Cl.
*H01L 27/00* (2006.01)
*H01L 51/00* (2006.01)
*H01L 27/32* (2006.01)
*H05K 1/03* (2006.01)
*G06K 9/00* (2006.01)
(Continued)

(52) U.S. Cl.
CPC .... *H01L 27/3244* (2013.01); *G02F 1/133305* (2013.01); *G06F 3/0412* (2013.01); *G06K 9/00013* (2013.01); *H01L 51/0097* (2013.01); *H05K 1/0393* (2013.01); *H05K 1/118* (2013.01)

(58) Field of Classification Search
CPC ............ H01L 27/3244; H01L 27/1214; H01L 27/1218; H01L 27/3255; H01L 27/3276; H01L 51/0097; H01L 51/00; H01L 51/524; H01L 51/56; H01L 51/50; H01L 51/52; H05K 1/0393; H05K 1/118; H05K 1/189; H05K 1/147; H05K 1/0216; H05K 1/11; G02F 1/133305; G02F 1/13452; G02F 1/133615; G02F 1/133528; G02F 1/133533; G02F 1/13454; G06F 3/0412; G06F 3/0416; G06F 3/041; G06F 3/1647
See application file for complete search history.

(56) References Cited

U.S. PATENT DOCUMENTS 8,072,765 B2  12/2011  Yumoto et al.
8,144,473 B2   3/2012  Yumoto et al.
(Continued)

FOREIGN PATENT DOCUMENTS

CN    1598649      3/2005
CN    109671352    4/2019
TW    201200939    1/2012

OTHER PUBLICATIONS

"Office Action of Taiwan Counterpart Application", dated May 1, 2020, p. 1-p. 7.

*Primary Examiner* — Nikolay K Yushin
(74) *Attorney, Agent, or Firm* — JCIPRNET

(57) ABSTRACT

A chip on film package structure including a flexible film and a chip is provided. The flexible film includes a main body and a first wing body. The main body includes a main bonding portion configured to be bonded to a first substrate. The first wing body includes a first extending part and a first bent part. The first extending part is extended from a side of the main body. The first bent part is configured to be bent to a second substrate and having a first wing bonding portion. The first wing bonding portion is configured to be bonded to the second substrate. The first substrate and the second substrate are stacked on top of each other. The chip mounted on and electrically connected to the main body. A display device is also provided.

20 Claims, 9 Drawing Sheets

(51) Int. Cl.
*G02F 1/1333* (2006.01)
*G06F 3/041* (2006.01)
*H05K 1/11* (2006.01)

(56) References Cited

U.S. PATENT DOCUMENTS

| | | |
|---|---|---|
| 9,113,545 B2 * | 8/2015 | Han .................. H05K 7/00 |
| 2005/0088830 A1 | 4/2005 | Yumoto et al. |
| 2011/0051382 A1 | 3/2011 | Yumoto et al. |
| 2011/0315536 A1 | 12/2011 | Chiou et al. |
| 2013/0148312 A1 * | 6/2013 | Han .................. H05K 1/028 |
| | | 361/736 |
| 2015/0022483 A1 * | 1/2015 | Lai .................. G06F 3/044 |
| | | 345/174 |

* cited by examiner

CHIP ON FILM PACKAGE AND DISPLAY DEVICE

BACKGROUND

Technical Field

The present disclosure generally relates to electronic device. More particularly, the present disclosure relates to a chip on film (COF) package structure or a display device.

Description of Related Art

Along with the advancement of packaging technology, chip on film (COF) bonding technology has become today's one of the major packaging technologies. Generally, COF bonding technology can be applied broadly, for example, the electrical connection between a liquid crystal panel and a drive IC element is one application of COF bonding technology.

SUMMARY

Accordingly, the present disclosure is directed to provide a COF package structure or a display device having higher integration or the bonding yield.

The present disclosure provides a chip on film package structure including a flexible film and a chip. The flexible film includes a main body and a first wing body. The main body includes a main bonding portion configured to be bonded to a first substrate. The first wing body includes a first extending part and a first bent part. The first extending part is extended from a side of the main body. The first bent part is configured to be bent to a second substrate and having a first wing bonding portion. The first wing bonding portion is configured to be bonded to the second substrate. The first substrate and the second substrate are stacked on top of each other. The chip mounted on and electrically connected to the main body.

According to an embodiment of the present disclosure, the first substrate is stacked on top of the second substrate, and the first bent part is bent downward, so as to be bonded to the second substrate through the first wing bonding portion.

According to an embodiment of the present disclosure, the second substrate is stacked on top of the first substrate, and the first bent part is bent upward, so as to be bonded to the second substrate through the first wing bonding portion.

According to an embodiment of the present disclosure, the first substrate and the second substrate are glass substrates or organic films.

According to an embodiment of the present disclosure, the flexible film further includes a second wing body. The second wing body includes a second extending part and a second bent part having a second wing bonding portion. The first extending part and the second extending part are extended from two opposite sides of the main body respectively. The first bent part and the second bent part are bent and bonded to two bonding regions of the second substrate through the first wing bonding portion and the second wing bonding portion.

According to an embodiment of the present disclosure, a bonding region of the first substrate where the main bonding portion is bonded is located between the two bonding regions of the second substrate.

According to an embodiment of the present disclosure, the chip on film package structure further includes a third substrate. The flexible film further includes a second wing body. The second wing body includes a second extending part and a second bent part having a second wing bonding portion. The first substrate, the second substrate and the third substrate are stacked on top of one another. The first extending part and the second extending part are extended from two opposite sides of the main body respectively. The second bent part is bent and bonded to a bonding region of the third substrate through the second wing bonding portion.

According to an embodiment of the present disclosure, the third substrate is a glass substrate or an organic film.

According to an embodiment of the present disclosure, the main body further includes a sub bonding portion configured to be bonded to a flexible printed circuit (FPC) board.

According to an embodiment of the present disclosure, the sub bonding portion is disposed on a side of the main body opposite to the main bonding portion.

The present disclosure provides a display device. The display device includes a first substrate, a second substrate, a flexible film, and a chip. The first substrate and the second substrate are stacked on top of each other. The flexible film includes a main body and a first wing body. The main body includes a main bonding portion bonded to the first substrate. The first wing body includes a first extending part and a first bent part. The first extending part extended from a side of the main body. The first bent part bent to the second substrate and having a first wing bonding portion bonded to the second substrate. The chip mounted on and electrically connected to the main body.

According to an embodiment of the present disclosure, the display device is an LCD display device or an OLED display device.

According to an embodiment of the present disclosure, the flexible film further includes a second wing body. The second wing body includes a second extending part and a second bent part having a second wing bonding portion. The first extending part and the second extending part are extended from two opposite sides of the main body respectively. The first bent part and the second bent part are bent and bonded to two bonding regions of the second substrate through the first wing bonding portion and the second wing bonding portion.

According to an embodiment of the present disclosure, the display device further includes a plurality of pixel electrodes, a plurality of touch sensors, and a plurality of fingerprint sensors. The pixel electrodes and the touch sensors are disposed on the first substrate and electrically connected to the main bonding portion. The fingerprint sensors are disposed on the second substrate and electrically connected to the first wing bonding portion and the second wing bonding portion.

According to an embodiment of the present disclosure, the display device further includes a plurality of pixel electrodes, a plurality of fingerprint sensors, and a plurality of touch sensors. The pixel electrodes are disposed on the first substrate and electrically connected to the main bonding portion. The fingerprint sensors and the touch sensors are disposed on the second substrate and electrically connected to the first wing bonding portion and the second wing bonding portion.

According to an embodiment of the present disclosure, a bonding region of the first substrate where the main bonding portion is bonded is located between the two bonding regions of the second substrate.

According to an embodiment of the present disclosure, the display device further includes a third substrate. The flexible film further includes a second wing body. The second wing body includes a second extending part and a second bent part having a second wing bonding portion. The first substrate, the second substrate and the third substrate are stacked on top of one another. The first extending part and the second extending part are extended from two opposite sides of the main body respectively. The second bent part is bent and bonded to a bonding region of the third substrate through the second wing bonding portion.

According to an embodiment of the present disclosure, the display device further includes a plurality of pixel electrodes, a plurality of fingerprint sensors, and a plurality of touch sensors. The pixel electrodes are disposed on the first substrate and electrically connected to the main bonding portion. The fingerprint sensors are disposed on the second substrate and electrically connected to the first wing bonding portion. The touch sensors are disposed on the third substrate and electrically connected to the second wing bonding portion.

According to an embodiment of the present disclosure, the display device further includes a plurality of pixel electrodes, a plurality of touch sensors, and a plurality of fingerprint sensors. The pixel electrodes and the sensors are disposed on the first substrate and electrically connected to the main bonding portion. The fingerprint sensors are disposed on the second substrate and electrically connected to the first wing bonding portion.

According to an embodiment of the present disclosure, the display device further includes a plurality of pixel electrodes and a plurality of touch sensors. The pixel electrodes are disposed on the first substrate and electrically connected to the main bonding portion. The touch sensors disposed on the second substrate and electrically connected to the first wing bonding portion.

According to an embodiment of the present disclosure, the display device further includes a plurality of pixel electrodes, a plurality of fingerprint sensors, and a plurality of touch sensors. The pixel electrodes and the fingerprint sensors are disposed on the first substrate and electrically connected to the main bonding portion. The touch sensors are disposed on the second substrate and electrically connected to the first wing bonding portion.

According to an embodiment of the present disclosure, the display device further includes a flexible printed circuit (FPC) board bonded to a sub bonding portion of the main body.

In light of the foregoing, in the COF package structure or the display device of the disclosure, a flexible film includes a main body and at least one wing body. The main body includes a main bonding portion. The wing body includes an extending part and a bent part. The extending part is extended from a side of the main body. The bent part is configured to be bent and having a wing bonding portion. As such, the main bonding portion may be configured to be bonded to a substrate, and the wing bonding portion may be configured to be bonded to another substrate. Therefore, the integration or the bonding yield of the COF package structure or the display device can be significantly improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
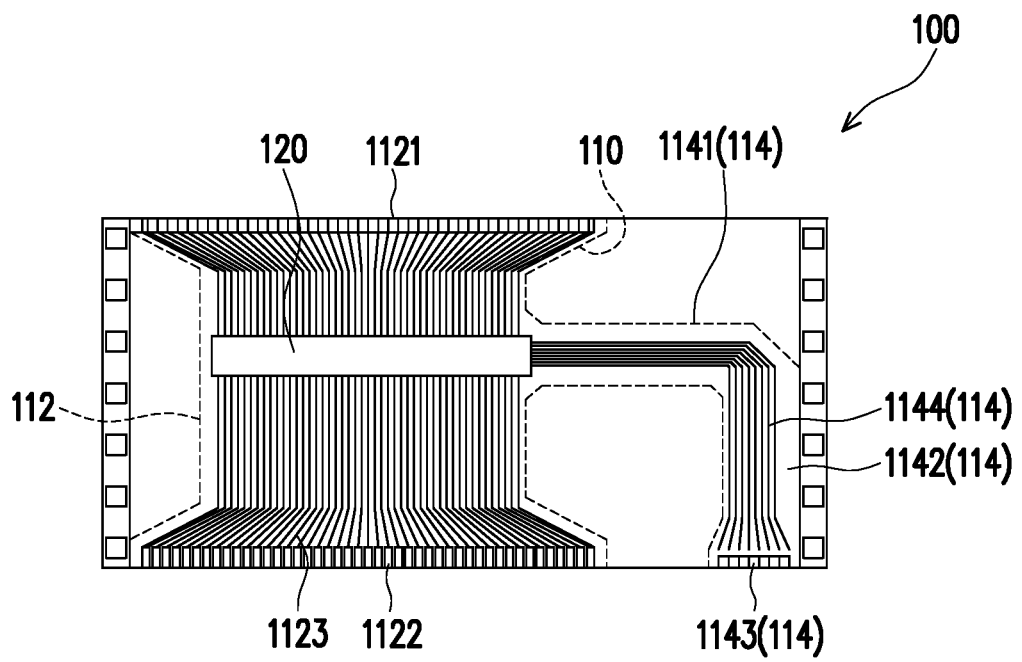
FIG. 1 illustrates a perspective top view of a partial manufacturing method of a chip on film package structure according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Reference will now be made in detail to the present preferred embodiments of the disclosure, examples of which are illustrated in the accompanying drawings. Wherever possible, the same reference numbers are used in the drawings and the description to refer to the same or like parts. The terms used herein such as "on", "above", "below", "front", "back", "left" and "right" are for the purpose of describing directions in the figures only and are not intended to be limiting of the disclosure. Further, in the discussion and claims herein, the term "on" used with respect to two materials, one "on" the other, means at least some contact between the materials, while "over" and "overlie" mean the materials are in proximity, but possibly with one or more additional intervening materials such that physical contact is possible but not required. Neither "on" nor "over" implies any directionality as used herein.

Unless limited otherwise, the terms "disposed", "connected", "coupled", "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Accordingly, the drawings and descriptions will be regarded as illustrative in nature and not as restrictive.

Figure 2:
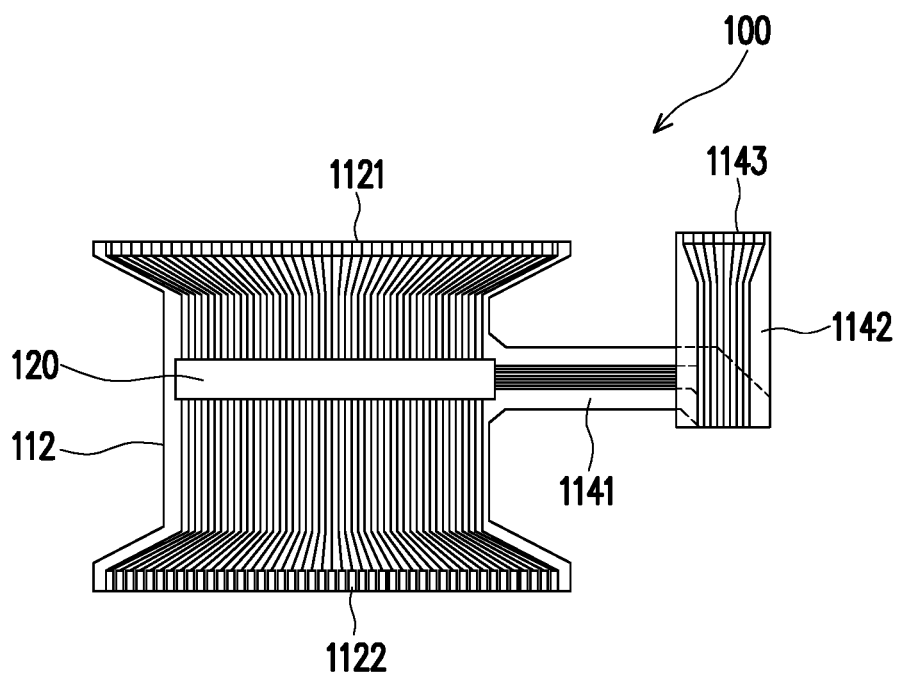
FIG. 2 illustrates a perspective top view of a chip on film package structure according to an embodiment of the disclosure.

FIG. 1 illustrates a perspective top view of a partial manufacturing method of a chip on film package according to an embodiment of the disclosure. FIG. 2 illustrates a perspective top view of a chip on film package according to an embodiment of the disclosure.

Referring to FIG. 1, a chip 120 may be disposed on a flexible film 110.

In an embodiment, the flexible film 110 may be a flexible circuit film. In other words, the flexible film 110 may include a plurality of wirings 1123, 1144 on a flexible substrate, but the disclosure is not limited thereto.

In an embodiment, the chip 120 may be a sensing touch display integration (STDI) IC, but the disclosure is not limited thereto.

The chip 120 may be electrically connected to the wirings 1123, 1144 of the flexible film 110 after being disposed on a flexible film 110.

Referring to FIGS. 1 to 2, after the chip 120 are disposed, the flexible film 110 may be cut along a cutting line (e.g., a dash line shown in FIG. 1) to form the chip on film (COF) package structure 100.

In an embodiment, the ends (e.g., the ends away from the chip 120 or near the edge of the COF package structure 100) of the the wirings 1123, 1144 may include contact pads, but the disclosure is not limited thereto.

Referring to FIG. 2, in the present embodiment, the COF package structure 100 includes a flexible film 110 and a chip 120. The flexible film 110 includes a main body 112 and a first wing body 114. The main body 112 includes a main bonding portion 1121. The first wing body 114 includes a first extending part 1141 and a first bent part 1142. The first extending part 1141 is extended from a side of the main body 112. The first bent part 1142 is configured to be bent and having a first wing bonding portion 1143. The chip 120 mounted on and electrically connected to the main body 112.

In an embodiment, the main wirings 1123 may be disposed on the main bonding portion 1121 and electrically connected to chip 120.

In an embodiment, the main body 112 may further include a sub bonding portion 1122 opposite to the main bonding portion 1121. The main wirings 1123 may be further disposed on the sub bonding portion 1122 and electrically connected to chip 120.

In an embodiment, the main wirings 1144 may be disposed on the first wing body 114 and electrically connected to chip 120.

It should be noted that the present embodiment does not limit the bending manner of the COF package structure 100.

Figure 4:
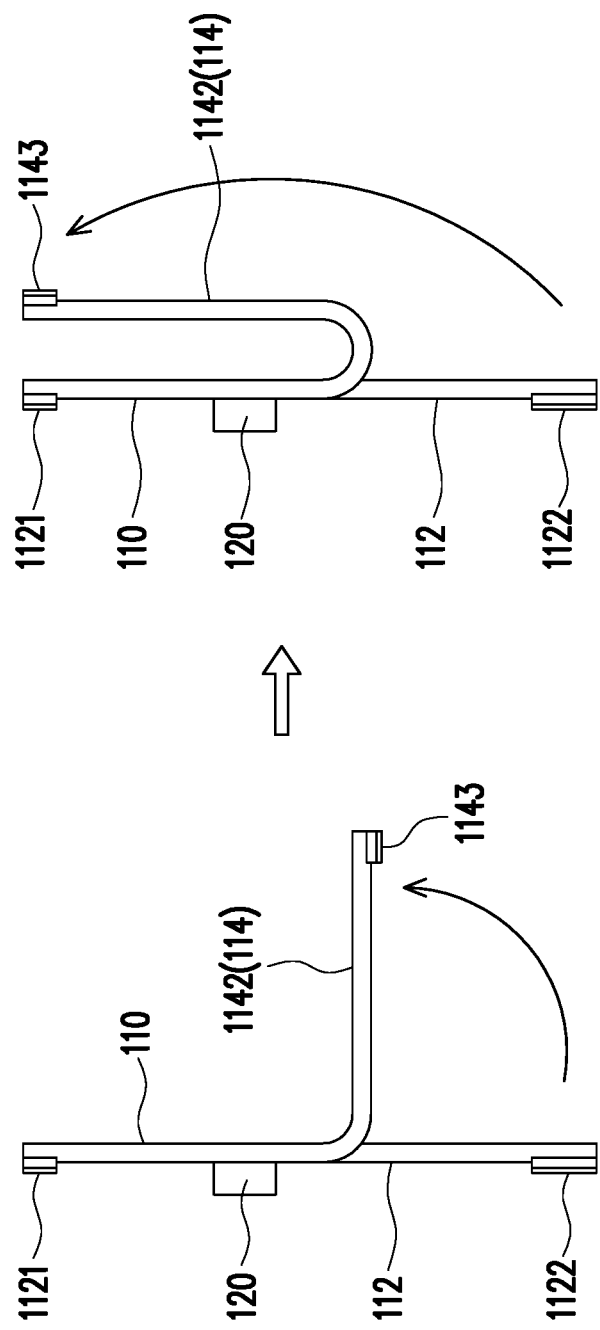
FIG. 4 illustrates a side view of a bending manner of a chip on film package structure according to an embodiment of the disclosure.

For example, referring to FIGS. 2 and 4, FIG. 4 illustrates a side view of a bending manner of a chip on film package according to an embodiment of the disclosure. In an embodiment, the first bent part 1142 may be bent downward, such that the main wirings 1123 on the main bonding portion 1121 and the wing wirings on the first wing bonding portion 1143 may be back to back. In other words, in a side view, the exposed surface of the end of the main wirings 1123 on the main bonding portion 1121 and the exposed surface of the end of the wing wirings 1144 on the first bent part 1142 may both face outward.

Figure 5:
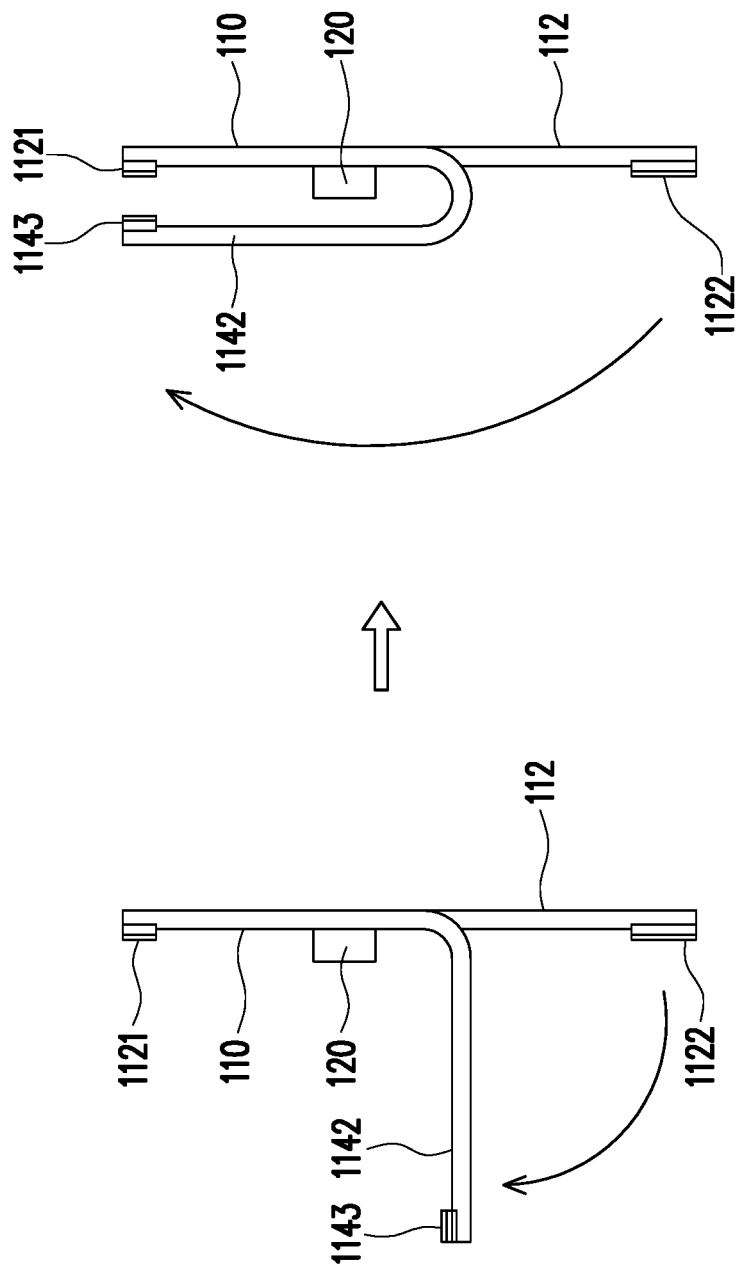
FIG. 5 illustrates a side view of another bending manner of a chip on film package structure according to an embodiment of the disclosure.

For example, referring to FIGS. 2 and 5, FIG. 5 illustrates a side view of another bending manner of a chip on film package according to an embodiment of the disclosure. In an embodiment, the first bent part 1142 may be bent upward, such that the main wirings 1123 on the main bonding portion 1121 and the wing wirings on the first wing bonding portion 1143 may be face to face. In other words, in a side view, the exposed surface of the end of the main wirings 1123 on the main bonding portion 1121 and the exposed surface of the end of the wing wirings 1144 on the first bent part 1142 may both face inward.

Figure 3:
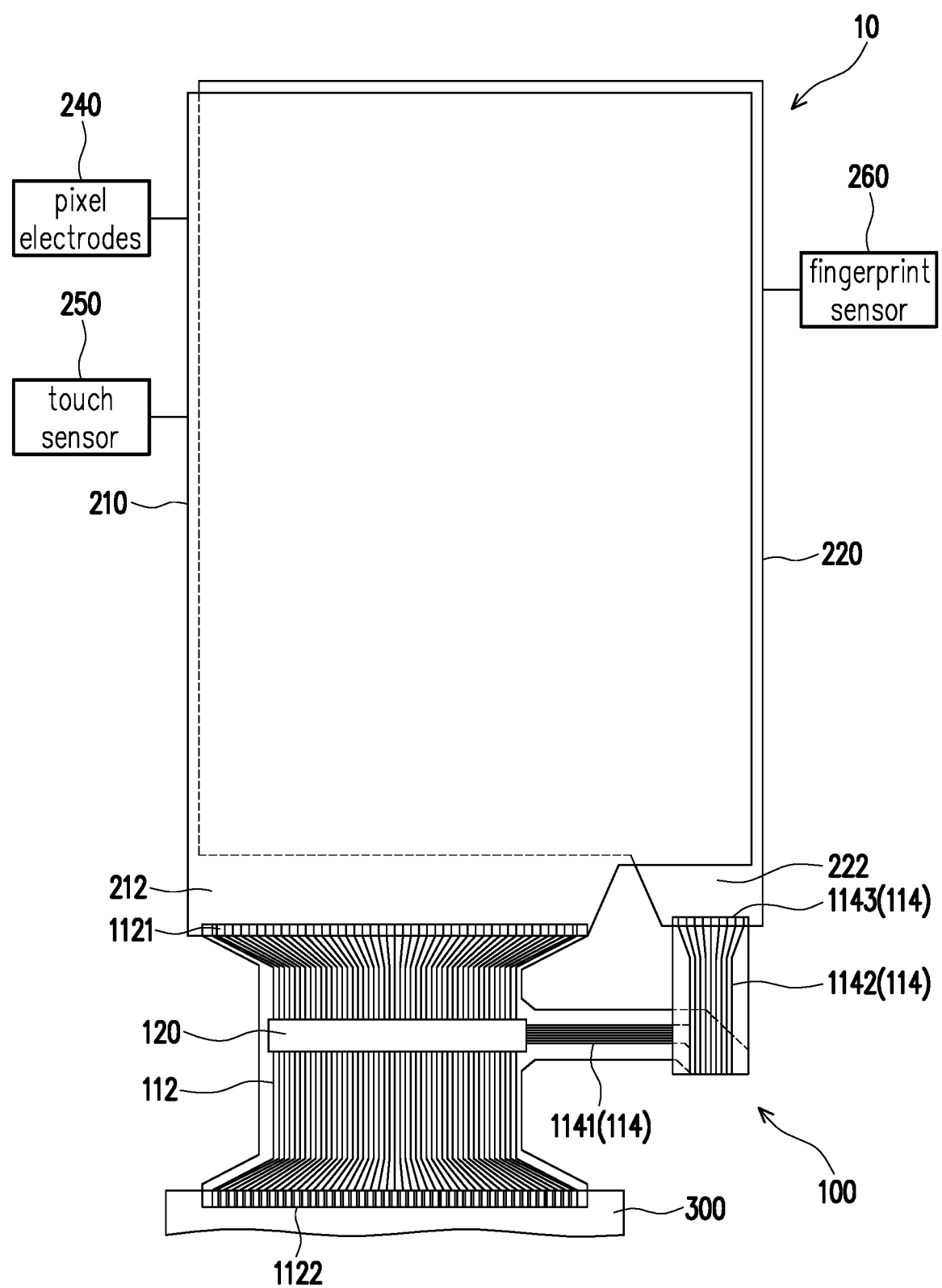
FIG. 3 illustrates a perspective top view of a chip on film package structure according to an embodiment of the disclosure.

Referring to FIG. 3, in an embodiment, the COF package structure 100 may further include a first substrate 210 and a second substrate 220. The main bonding portion 1121 may be configured to be bonded to a bonding region 212 of the first substrate 210. The first bent part 1142 may be configured to be bent to a second substrate 220 as shown in either FIG. 4 or FIG. 5. The first wing bonding portion 1143 may be configured to be bonded to a bonding region 222 of the second substrate 220. The first substrate 210 and the second substrate 220 are stacked on top of each other.

In an embodiment, the first substrate 210 may be a glass substrate or an organic film, and/or the second substrate 220 may be a glass substrate or an organic film. The material of the first substrate 210 may be the same or different from the material of the second substrate 220, but the disclosure is not limited thereto.

In an embodiment, the first substrate 210 may be stacked on top of the second substrate 220, and the first bent part 1142 may be bent downward (as shown in FIG. 4), so as to be bonded to the second substrate 220 through the first wing bonding portion 1143.

In an embodiment, the second substrate 220 may be stacked on top of the first substrate 210, and the first bent part 1142 may be bent upward (as shown in FIG. 5), so as to be bonded to the second substrate 220 through the first wing bonding portion 1143.

In an embodiment, a plurality of pixel electrodes 240 may be disposed on the first substrate 220 and electrically connected to the corresponding certain main wirings 1123 disposed on main bonding portion 1121.

In an embodiment, a chip on film package 100 including the first substrate 220 having the pixel electrodes 240 thereon may be referred as a display device 10. The display device 10 may be an LCD display device or an OLED display device, but the disclosure is not limited thereto. In other words, FIG. 3 may be illustrated as a perspective top view of a display device 10 according to an embodiment of the disclosure.

In an embodiment, a plurality of touch sensors 250 may be disposed on the first substrate 210 and electrically connected to the corresponding certain main wirings 1123 disposed on main bonding portion 1121.

In an embodiment, a plurality of fingerprint sensors 260 may be disposed on the second substrate 220 and electrically connected to the corresponding certain wing wirings 1144 disposed on the first wing bonding portion 1143.

In an embodiment, the COF package structure 100 may further include a third substrate 300. The sub bonding portion 1122 may be configured to be bonded to the third substrate 300.

In an embodiment, the third substrate 300 may be a flexible printed circuit (FPC) board, but the disclosure is not limited thereto.

Figure 6:
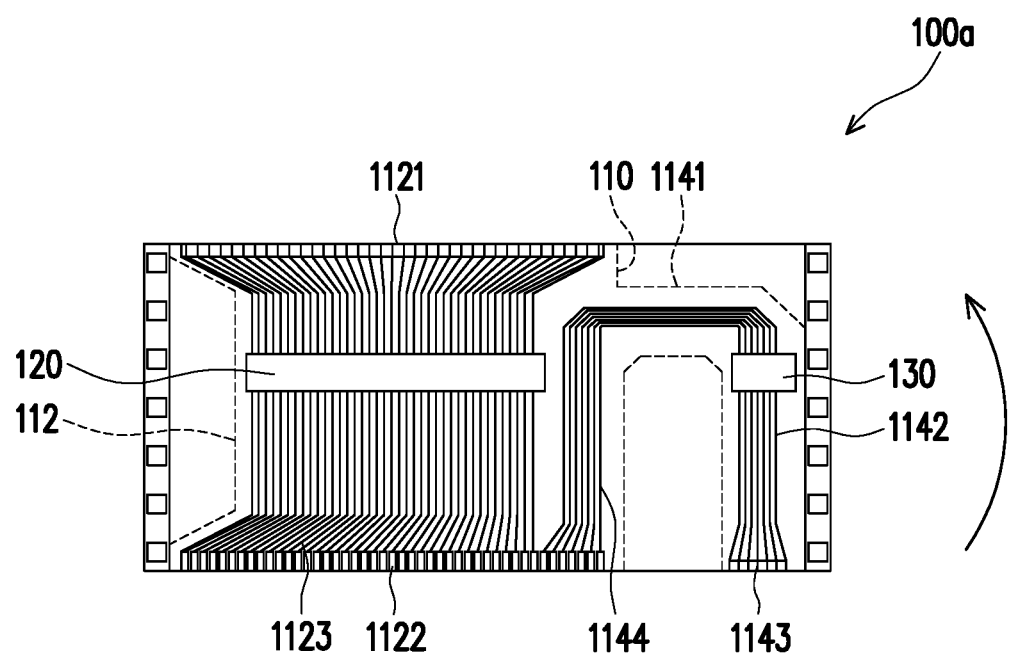
FIG. 6 illustrates a perspective top view of a partial manufacturing method of a chip on film package structure according to an embodiment of the disclosure.
Figure 7:
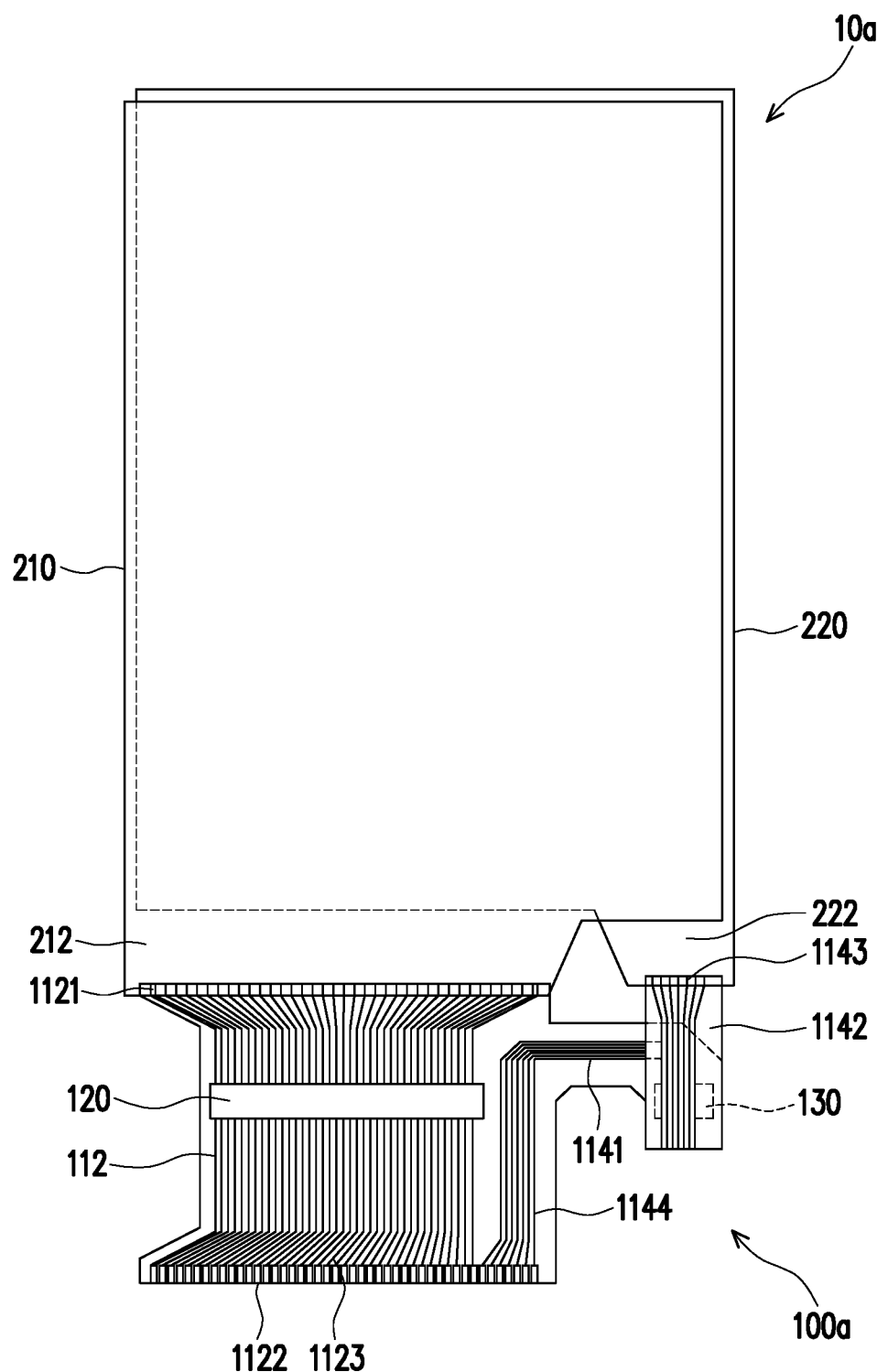
FIG. 7 illustrates a perspective top view of a chip on film package structure according to an embodiment of the disclosure.

FIG. 6 illustrates a perspective top view of a partial manufacturing method of a chip on film package according to an embodiment of the disclosure. FIG. 7 illustrates a perspective top view of a chip on film package according to an embodiment of the disclosure.

Referring to FIG. 6, a chip 120 and a chip 130 may be disposed on a flexible film 110.

In an embodiment, the chip 120 may be a touch with display driver integration (TDDI) IC, and the chip 130 may be a readout (RO) IC, but the disclosure is not limited thereto.

The chip 120 may be electrically connected to the wirings 1123 of the flexible film 110 after being disposed on a flexible film 110, the chip 130 may be electrically connected to the wirings 1144 of the flexible film 110 after being disposed on a flexible film 110.

Referring to FIGS. 6 to 7, after the chips 120, 130 are disposed, the flexible film 110 may be cut a cutting line (e.g., a dash line shown in FIG. 6) to form the chip on film (COF) package structure 100a.

In an embodiment, a chip on film package 100a including the first substrate 210 or the second substrate 220 having the pixel electrodes (as the pixel electrodes 240 shown in FIG. 3) thereon may be referred as a display device 10a. In other words, FIG. 7 may be illustrated as a perspective top view of a display device 10a according to an embodiment of the disclosure.

Figure 8:
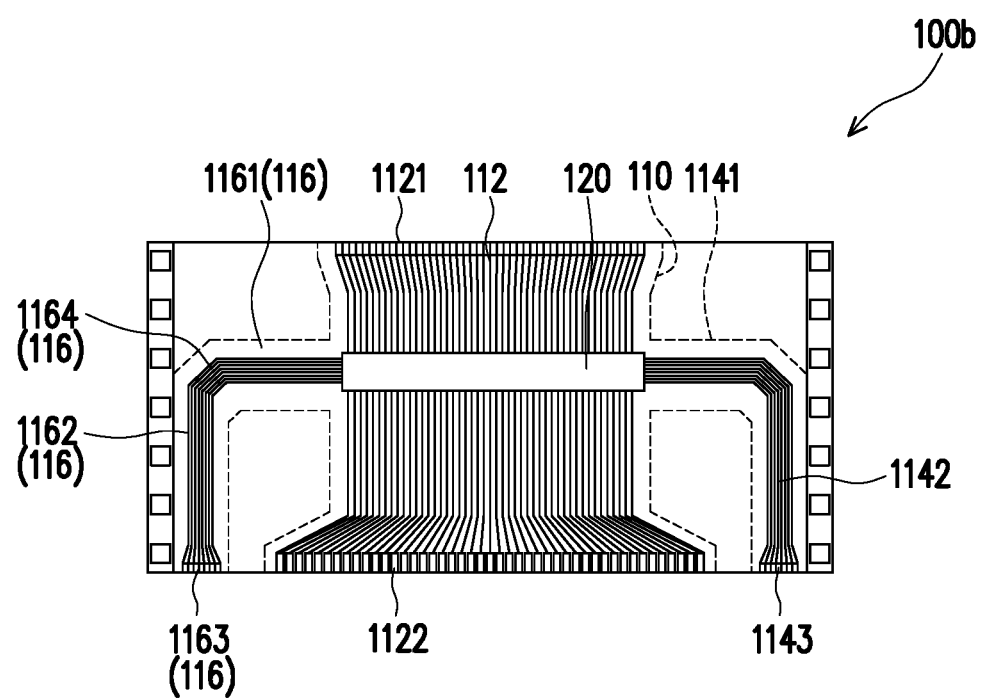
FIG. 8 illustrates a perspective top view of a partial manufacturing method of a chip on film package structure according to an embodiment of the disclosure.
Figure 9:
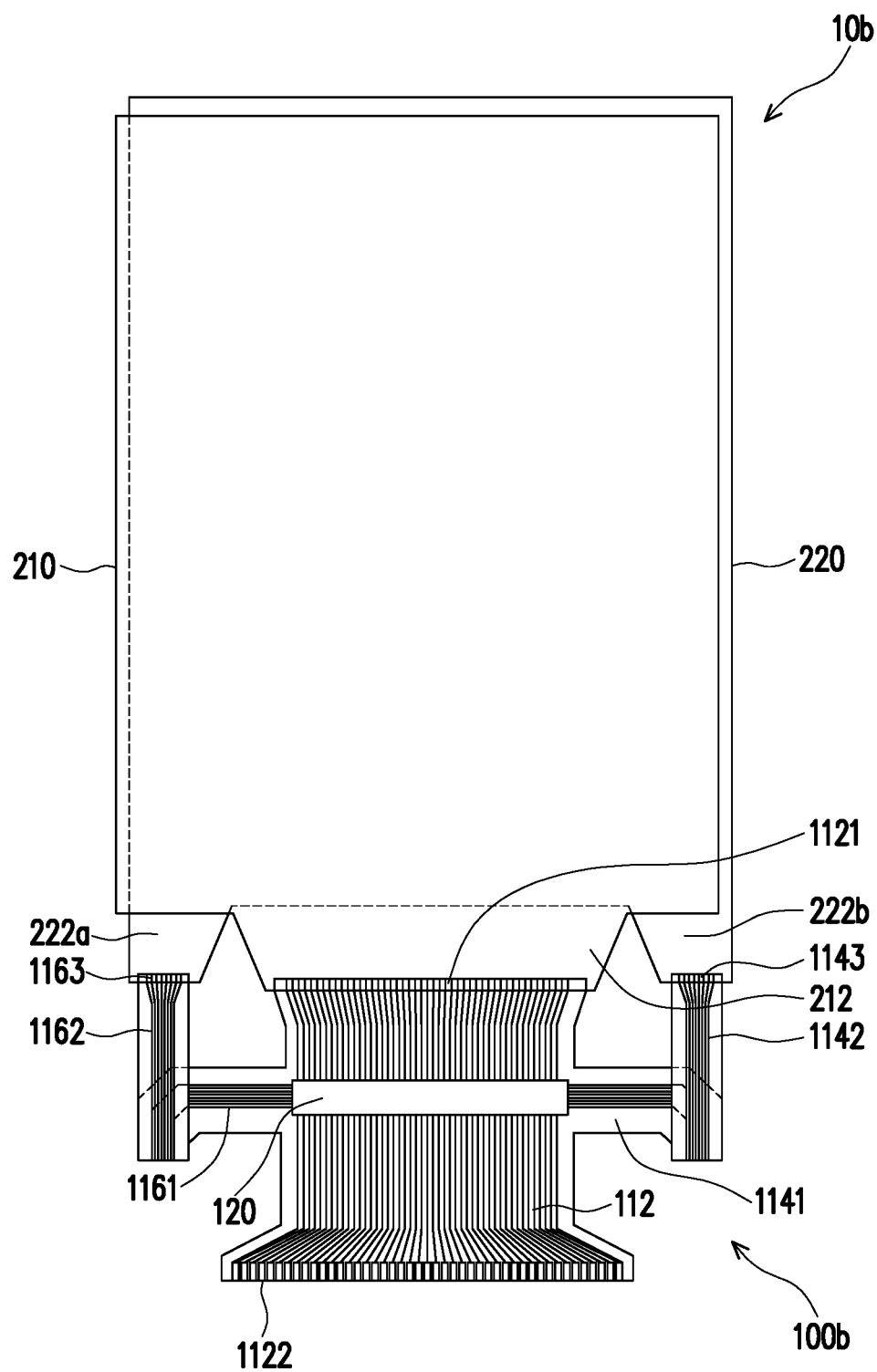
FIG. 9 illustrates a perspective top view of a chip on film package structure according to an embodiment of the disclosure.

FIG. 8 illustrates a perspective top view of a partial manufacturing method of a chip on film package according to an embodiment of the disclosure. FIG. 9 illustrates a perspective top view of a chip on film package according to an embodiment of the disclosure.

Referring to FIGS. 8 to 9, after the chip 120 are disposed, the flexible film 110 may be cut along a cutting line (e.g., a dash line shown in FIG. 8) to form the chip on film (COF) package structure 100b.

In some embodiments, the flexible film 110 may further include a second wing body 116. The second wing body 116 may include a second extending part 1161 and a second bent part 1162. The second bent part 1162 is configured to be bent and having a second wing bonding portion 1163. The first extending part 1141 and the second extending part 1161 are extended from two opposite sides of the main body 112 respectively. The first bent part 1142 may be bent and bonded to the bonding region 222b of the second substrate 220 through the first wing bonding portion 1143. The second bent part 1162 may be bent and bonded to the bonding region 222a of the second substrate 220 through the second wing bonding portion 1163.

In an embodiment, the bonding region 212 of the first substrate 210 where the main bonding portion 1121 is bonded is located between the two bonding regions 222a, 222b of the second substrate 220.

In an embodiment, a chip on film package 100b including the first substrate 210 or the second substrate 220 having the pixel electrodes (as the pixel electrodes 240 shown in FIG. 3) thereon may be referred as a display device 10b. In other words, FIG. 9 may be illustrated as a perspective top view of a display device 10b according to an embodiment of the disclosure.

Figure 10:
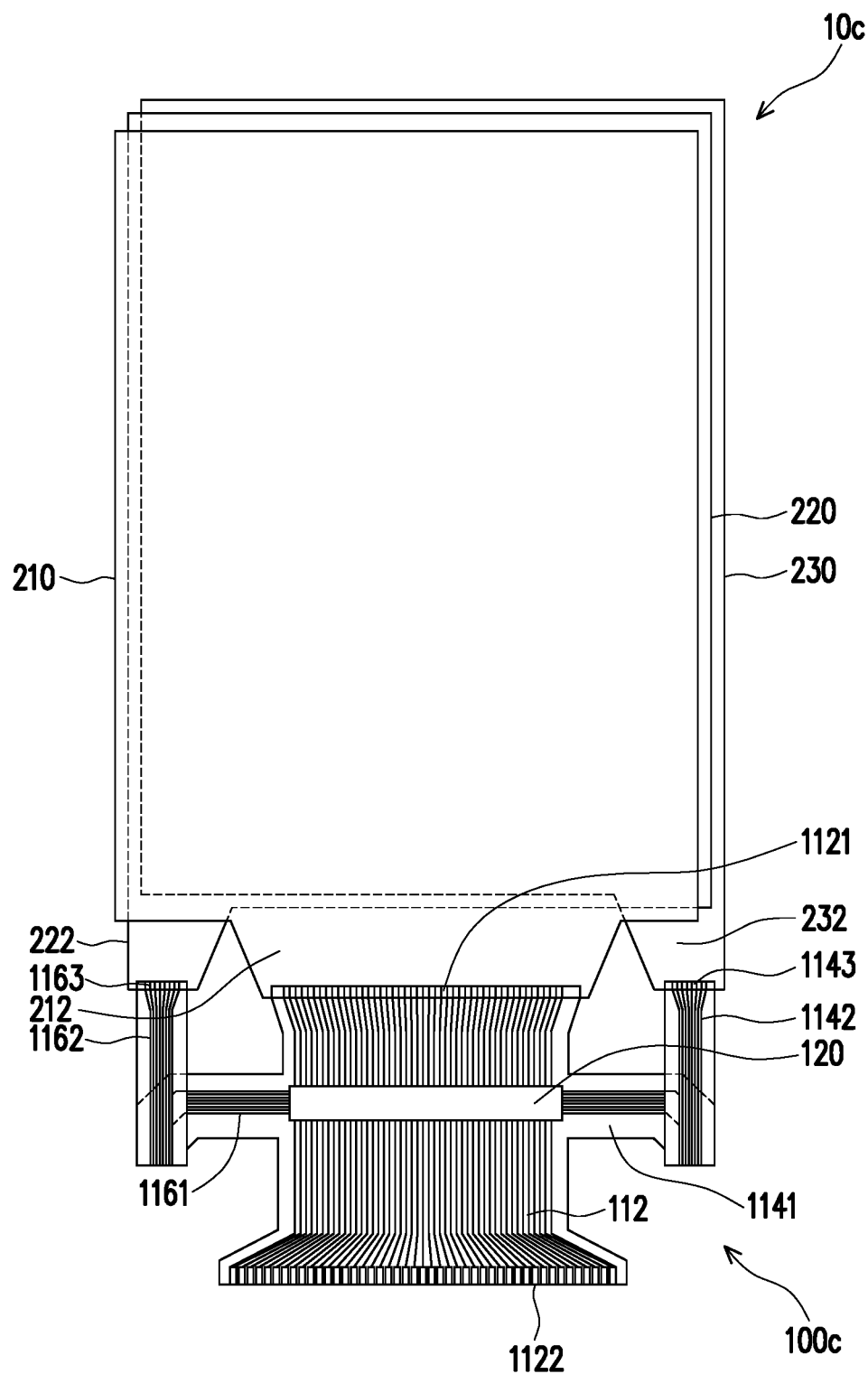
FIG. 10 illustrates a perspective top view of a chip on film package structure according to an embodiment of the disclosure.

FIG. 10 illustrates a perspective top view of a chip on film package according to an embodiment of the disclosure.

In an embodiment, the COF package structure 100c may further include a third substrate 230. The first wing bonding portion 1143 may be configured to be bonded to the bonding region 232 of the third substrate 230, and the second wing bonding portion 1163 may be configured to be bonded to the bonding region 222 of the second substrate 220.

In an embodiment, the third substrate 230 may be a glass substrate or an organic film, but the disclosure is not limited thereto.

In an embodiment, a chip on film package 100c including the first substrate 210, the second substrate 220, or the third substrate 230 having the pixel electrodes (as the pixel electrodes 240 shown in FIG. 3) thereon may be referred as a display device 10c. In other words, FIG. 10 may be illustrated as a perspective top view of a display device 10b according to an embodiment of the disclosure.

Based on the above discussions, it can be seen that the present disclosure offers various advantages. It is understood, however, that not all advantages are necessarily discussed herein, and other embodiments may offer different advantages, and that no particular advantage is required for all embodiments.

In sum, in the COF package structure or the display device of the disclosure, a flexible film includes a main body and at least one wing body. The main body includes a main bonding portion. The wing body includes an extending part and a bent part. The extending part is extended from a side of the main body. The bent part is configured to be bent and having a wing bonding portion. As such, the main bonding portion may be configured to be bonded to a substrate, and the wing bonding portion may be configured to be bonded to another substrate. Therefore, the integration or the bonding yield of the COF package structure or the display device can be significantly improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package structure, comprising:
   a flexible film comprising:
      a main body comprising a main bonding portion configured to be bonded to a first substrate; and
      a first wing body comprising a first extending part extended from a side of the main body and a first bent part configured to be bent to a second substrate and having a first wing bonding portion configured to be bonded to the second substrate, wherein the first substrate and the second substrate are stacked on top of each other; and
   a chip mounted on and electrically connected to the main body,
   wherein the main body further comprises a sub bonding portion configured to be bonded to a flexible printed circuit (FPC) board.

2. The chip on film package structure as claimed in claim 1, wherein the first substrate is stacked on top of the second substrate, and the first bent part is bent downward, so as to be bonded to the second substrate through the first wing bonding portion.

3. The chip on film package structure as claimed in claim 1, wherein the second substrate is stacked on top of the first substrate, and the first bent part is bent upward, so as to be bonded to the second substrate through the first wing bonding portion.

4. The chip on film package structure as claimed in claim 1, wherein the first substrate and the second substrate are glass substrates or organic films.

5. The chip on film package structure as claimed in claim 1, wherein the sub bonding portion is disposed on a side of the main body opposite to the main bonding portion.

6. A chip on film package structure comprising:
   a flexible film comprising:
      a main body comprising a main bonding portion configured to be bonded to a first substrate; and
      a first wing body comprising a first extending part extended from a side of the main body and a first bent part configured to be bent to a second substrate and having a first wing bonding portion configured to be bonded to the second substrate, wherein the first substrate and the second substrate are stacked on top of each other; and a chip mounted on and electrically connected to the main body, wherein the flexible film further comprises a second wing body comprising a second extending part and a second bent part having a second wing bonding portion, the first extending part and the second extending part are extended from two opposite sides of the main body respectively, and the first bent part and the second bent part are bent and bonded to two bonding regions of the second substrate through the first wing bonding portion and the second wing bonding portion.

7. The chip on film package structure as claimed in claim 6, wherein a bonding region of the first substrate where the main bonding portion is bonded is located between the two bonding regions of the second substrate.

8. A chip on film package structure comprising:
a flexible film comprising:
   a main body comprising a main bonding portion configured to be bonded to a first substrate; and
   a first wing body comprising a first extending part extended from a side of the main body and a first bent part configured to be bent to a second substrate and having a first wing bonding portion configured to be bonded to the second substrate, wherein the first substrate and the second substrate are stacked on top of each other;
a chip mounted on and electrically connected to the main body; and
a third substrate, wherein the flexible film further comprises a second wing body comprising a second extending part and a second bent part having a second wing bonding portion, the first substrate, the second substrate and the third substrate are stacked on top of one another, the first extending part and the second extending part are extended from two opposite sides of the main body respectively, and the second bent part is bent and bonded to a bonding region of the third substrate through the second wing bonding portion.

9. The chip on film package structure as claimed in claim 8, wherein the third substrate is a glass substrate or an organic film.

10. A display device, comprising:
a first substrate;
a second substrate, wherein the first substrate and the second substrate are stacked on top of each other;
a flexible film comprising:
   a main body comprising a main bonding portion bonded to the first substrate; and
   a first wing body comprising a first extending part extended from a side of the main body and a first bent part bent to the second substrate and having a first wing bonding portion bonded to the second substrate;
a chip mounted on and electrically connected to the main body; and
a flexible printed circuit (FPC) board bonded to a sub bonding portion of the main body.

11. The display device as claimed in claim 10, wherein the display device is an LCD display device or an OLED display device.

12. The display device as claimed in claim 10, further comprising a plurality of pixel electrodes and a plurality of touch sensors disposed on the first substrate and electrically connected to the main bonding portion, and a plurality of fingerprint sensors disposed on the second substrate and electrically connected to the first wing bonding portion.

13. The display device as claimed in claim 10, further comprising:
a plurality of pixel electrodes disposed on the first substrate and electrically connected to the main bonding portion; and
a plurality of touch sensors disposed on the second substrate and electrically connected to the first wing bonding portion.

14. The display device as claimed in claim 10, further comprising:
a plurality of pixel electrodes and a plurality of fingerprint sensors disposed on the first substrate and electrically connected to the main bonding portion; and
a plurality of touch sensors disposed on the second substrate and electrically connected to the first wing bonding portion.

15. The display device as claimed in claim 10, further comprising a third substrate, wherein the flexible film further comprises a second wing body comprising a second extending part and a second bent part having a second wing bonding portion, wherein the first substrate, the second substrate and the third substrate are stacked on top of one another, the first extending part and the second extending part are extended from two opposite sides of the main body respectively, and the second bent part is bent and bonded to a bonding region of the third substrate through the second wing bonding portion.

16. The display device as claimed in claim 15, further comprising:
a plurality of pixel electrodes disposed on the first substrate and electrically connected to the main bonding portion;
a plurality of fingerprint sensors disposed on the second substrate and electrically connected to the first wing bonding portion; and
a plurality of touch sensors disposed on the third substrate and electrically connected to the second wing bonding portion.

17. The display device as claimed in claim 10, wherein the flexible film further comprises a second wing body comprising a second extending part and a second bent part having a second wing bonding portion, the first extending part and the second extending part are extended from two opposite sides of the main body respectively, and the first bent part and the second bent part are bent and bonded to two bonding regions of the second substrate through the first wing bonding portion and the second wing bonding portion.

18. The display device as claimed in claim 17, further comprising:
a plurality of pixel electrodes and a plurality of touch sensors disposed on the first substrate and electrically connected to the main bonding portion; and
a plurality of fingerprint sensors disposed on the second substrate and electrically connected to the first wing bonding portion and the second wing bonding portion.

19. The display device as claimed in claim 17, further comprising:
a plurality of pixel electrodes disposed on the first substrate and electrically connected to the main bonding portion; and
a plurality of fingerprint sensors and a plurality of touch sensors disposed on the second substrate and electrically connected to the first wing bonding portion and the second wing bonding portion.

20. The display device as claimed in claim 17, wherein a bonding region of the first substrate where the main bonding portion is bonded is located between the two bonding regions of the second substrate.

\* \* \* \* \*